(12) United States Patent
Zhao et al.

(10) Patent No.: US 10,412,826 B2
(45) Date of Patent: Sep. 10, 2019

(54) CIRCUIT BOARD AND METHOD FOR MANUFACTURING THE SAME, TERMINAL TEST DEVICE

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventors: Pucha Zhao, Beijing (CN); Guoqing Zhang, Beijing (CN); Xiaopeng Bai, Beijing (CN); Hongwei Gao, Beijing (CN); Weifeng Wang, Beijing (CN); Yanbin Dang, Beijing (CN); Haotian Chen, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 0 days.

(21) Appl. No.: 15/944,206

(22) Filed: Apr. 3, 2018

(65) Prior Publication Data
US 2019/0075650 A1 Mar. 7, 2019

(30) Foreign Application Priority Data
Sep. 1, 2017 (CN) .......................... 2017 1 0777942

(51) Int. Cl.
*H01H 85/046* (2006.01)
*H05K 3/30* (2006.01)
*H05K 1/02* (2006.01)

(52) U.S. Cl.
CPC ......... *H05K 1/0293* (2013.01); *H01H 85/046* (2013.01); *H05K 1/0268* (2013.01); *H05K 3/30* (2013.01); *H05K 2201/10181* (2013.01)

(58) Field of Classification Search
CPC .... H05K 1/0257; H05K 1/0259; H05K 1/026; H05K 1/0254; H05K 2201/10181;
(Continued)

(56) References Cited

U.S. PATENT DOCUMENTS 6,667,461 B1 * 12/2003 Cogan .................. H02H 9/026
219/209
8,762,083 B2 * 6/2014 Rodseth ................. G01R 31/07
702/65
(Continued)

OTHER PUBLICATIONS

Shunfeng Cheng, Student Member, IEEE, Kwok Tom, Member, IEEE, and Michael Pecht, Fellow, IEEE Failure Precursors for Polymer Resettable Fuses IEEE Transactions on Device and Materials Reliability, vol. 10, No. 3, Sep. 2010.*
(Continued)

*Primary Examiner* — Andargie M Aychillhum
*Assistant Examiner* — Michael F McAllister
(74) *Attorney, Agent, or Firm* — Nath, Goldberg & Meyer; Joshua B. Goldberg

(57) ABSTRACT

The present application discloses a circuit board and a method for manufacturing the same, and a terminal test device. The circuit board includes a base substrate, and a plurality of conductive lines on the base substrate, each of the plurality of conductive lines having one end configured to be connected with a signal output bus of a signal generator and the other end configured to be connected with a terminal. A fuse is connected in series in each conductive line, and a breaking current IT of the fuse, a maximum operating current I of the conductive line and a fault current IF of the
(Continued)

conductive line satisfy: I<IT≤IF, where the breaking current IT of the fuse is a minimum current that causes the fuse to open.

18 Claims, 3 Drawing Sheets

(58) Field of Classification Search
CPC ...... H05K 1/0293; H05K 1/0268; H05K 3/30; H01H 85/046
USPC .................................. 174/250, 254; 337/158
See application file for complete search history.

(56) References Cited

U.S. PATENT DOCUMENTS

| | | | | |
|---|---|---|---|---|
| 2002/0080545 A1* | 6/2002 | Slater | ................... | H02H 9/042 361/106 |
| 2003/0052712 A1* | 3/2003 | Comer | ................ | H01L 23/5252 326/38 |
| 2006/0132277 A1* | 6/2006 | Hetherton | ............ | H01C 1/1406 336/232 |
| 2007/0025044 A1* | 2/2007 | Golubovic | ............. | H01C 7/102 361/124 |
| 2007/0159745 A1* | 7/2007 | Berberich | ........... | H01L 23/5256 361/59 |
| 2010/0023286 A1* | 1/2010 | Rodseth | ................. | H02H 3/046 702/65 |
| 2016/0282138 A1* | 9/2016 | Golubovic | ............... | G01D 3/08 |
| 2018/0006014 A1* | 1/2018 | Mayer | ................... | H02H 3/445 |
| 2018/0212372 A1* | 7/2018 | Golubovic | ......... | H01R 13/7137 |

OTHER PUBLICATIONS

Firelec Bulletin Rev: 12_2009 INT-DI162-F 16 channels—Discrete Input with fuse for dry contact.*
Littlefuse Fuse Characteristics, Terms and Consideration Factors Jul. 6, 2014.*
Shunfeng Cheng, Student Member, IEEE, Kwok Tom, Member, IEEE, and Michael Pecht, Fellow, IEEE Failure Precursors for Polymer Resettable Fuses IEEE Transactions on Device and Materials Reliability, Vol. 10, No. 3, September 2010 (Year: 2010).*
Firelec Bulletin Rev: 12_2009 NIT-D1162-F 16 channels—Discrete Input with fuse for dry contact (Year: 2009).*
Littlefuse Fuse Characteristics, Terms and Consideration Factors Jul. 6, 2014 (Year: 2014).*

* cited by examiner

CIRCUIT BOARD AND METHOD FOR MANUFACTURING THE SAME, TERMINAL TEST DEVICE

CROSS-REFERENCE TO RELATED APPLICATIONS

The present application claims priority to Chinese Patent Application No. 201710777942.4, filed on Sep. 1, 2017, the contents of which are incorporated herein by reference in the entirety.

TECHNICAL FIELD

The present disclosure relates to the field of terminal test, and particularly, to a circuit board and a method for manufacturing the same, and a terminal test device.

BACKGROUND

Terminal devices (hereinafter referred to as terminals) such as Organic Light-Emitting Diode (OLED) displays and Liquid Crystal Display (LCD) displays have been widely used in display filed due to their advantages such as low power consumption and being environment-friendly. Before use of a terminal, it is necessary to perform tests (e.g., light-on test) on life, brightness uniformity and aging degree, and the like, of the terminal.

SUMMARY

According to a first aspect of the present disclosure, there is provided a circuit board, including a base substrate, and a plurality of conductive lines on the base substrate, each of the plurality of conductive lines having one end configured to be connected with a signal output bus of a signal generator and the other end configured to be connected with a terminal.

A fuse is connected in series in each conductive line, and a breaking current IT of the fuse, a maximum operating current I of the conductive line and a fault current IF of the conductive line satisfy: I<IT≤IF, where the breaking current IT of the fuse is a minimum current that causes the fuse to open.

Optionally, the fuse is a polymer positive temperature coefficient (PPTC) fuse. Optionally, the maximum operating current I of each conductive line and a holding current IH of the PPTC fuse in the conductive line satisfy: I≤IH, where the holding current IH of the PPTC fuse is a maximum current that does not lead to a change of a resistance value of the PPTC fuse.

Optionally, the fault current IF of each conductive line and a maximum operating current Imax of the PPTC fuse in the conductive line satisfy: IF≤Imax, where the maximum operating current Imax of the PPTC fuse is a maximum current that causes no damage to the PPTC fuse.

Optionally, a maximum operating voltage V of each conductive line and a maximum operating voltage Vmax of the PPTC fuse in the conductive line satisfy: V≤Vmax, where the maximum operating voltage Vmax of the PPTC fuse is a maximum voltage that causes no damage to the PPTC fuse.

Optionally, an alarm is connected in series in each conductive line, and an alarm-triggering current IR of the alarm, the maximum operating current I of the conductive line and the fault current IF of the conductive line satisfy: I<IR≤IF or IF≤IR.

Optionally, the alarm is an audio-signal alarm or an optical-signal alarm.

Optionally, the circuit board is any one of a single-sided board, a multi-sided board and a multilayer board.

According to a second aspect of the present disclosure, there is provided a terminal test device, including any one of the circuit boards according to the first aspect.

Optionally, the terminal test device further includes a signal generator connected with the circuit board through a signal output bus.

Optionally, an over-current protection assembly is connected in series in the signal output bus.

According to a third aspect of the present disclosure, there is provided a method of manufacturing a circuit board, including: providing a base substrate; forming a plurality of conductive lines on the base substrate, each of the plurality of conductive lines having one end formed to be connected with a signal output bus of a signal generator and the other end formed to be connected with a terminal; and connecting a fuse in series in each conductive line, a breaking current IT of the fuse, a maximum operating current I of the conductive line and a fault current IF of the conductive line satisfying: I<IT≤IF, where the breaking current IT of the fuse is a minimum current that cause the fuse to open.

Optionally, the fuse is a polymer positive temperature coefficient (PPTC) fuse.

Optionally, the method further includes connecting an alarm in series in each conductive line, an alarm-triggering current IR of the alarm, the maximum operating current I of the conductive line and the fault current IF of the conductive line satisfy: I<IR≤IF or IF≤IF.

BRIEF DESCRIPTION OF THE DRAWINGS

The drawings for describing embodiments of the present disclosure will be briefly described as below, so as to clearly illustrate the solutions in the embodiments. Obviously, the drawings described below are merely some embodiments of the present disclosure, and for those skilled in the art, other drawings can be obtained from these drawings without creative efforts.

FIG. 4-1 is a schematic diagram illustrating terminals being tested by a terminal test device in a comparative example;

FIG. 4-2 is a schematic diagram illustrating terminals being tested by a terminal test device according to an embodiment of the present disclosure.

DETAILED DESCRIPTION

To make objects, solutions and advantages of the present disclosure clear, embodiments of the present disclosure will be further described below in conjunction with the accompanying drawings.

In a terminal test device, a signal generator is typically connected to a printed circuit board (PCB) through a signal output bus, so as to test a plurality of terminals simultaneously. The PCB is provided thereon with a plurality of conductive lines, each of which has one end configured to be connected with the signal output bus and the other end configured to be connected with the terminal.

However, when a current in one of the plurality of conductive lines is excessively large, the terminal connected with the conductive line is likely to be burned, resulting in damage to the terminal.

Figure 1:
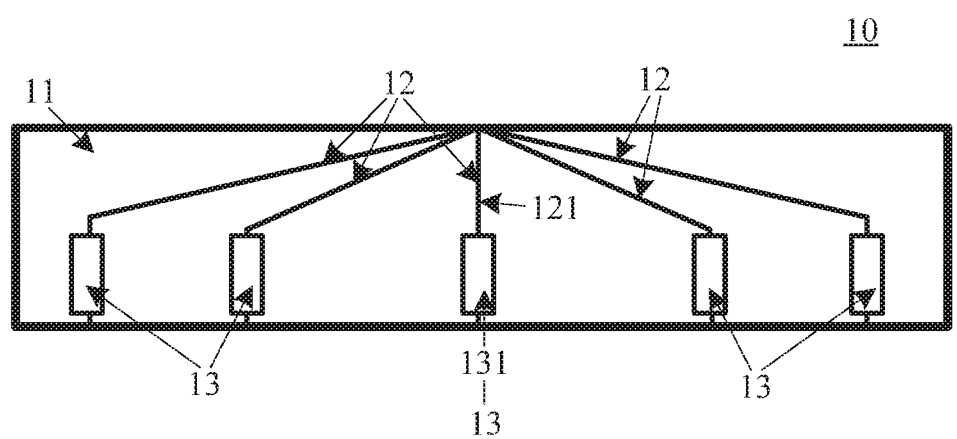
FIG. 1 is a schematic diagram illustrating a structure of a circuit board according to an embodiment of the present disclosure.

Embodiments of the present disclosure provide a circuit board. FIG. 1 is a schematic diagram illustrating a structure of a circuit board according to an embodiment of the present disclosure. As shown in FIG. 1, the circuit board 10 may include a base substrate 11 and a plurality of conductive lines 12 arranged on the base substrate 11.

Each of the plurality of conductive lines 12 has one end configured to be connected with a signal output bus of a signal generator and the other end configured to be connected with a terminal. A fuse 13 is connected in series in each conductive line 12. A breaking current IT of a first fuse 131, a maximum operating current I of a first conductive line 121 and a fault current IF of the first conductive line 121 satisfy: I<IT≤IF. In practical applications, the terminal is typically a display panel.

Herein, the first conductive line 121 is any one of the plurality of conductive lines 12, the first fuse 131 is the fuse connected in series in the first conductive line 121, and the breaking current IT of the first fuse 131 is a minimum current that causes the first fuse 131 to open.

In embodiments of the present disclosure, each of the plurality of conductive lines is connected with a terminal after a fuse is connected in series in the conductive line. In a case where a current in the first conductive line is a fault current or excessively large, the current in the first conductive line excesses the breaking current of the first fuse, such that the first fuse automatically opens to cut off the first conductive line, which in turn prevents the terminal connected with the first conductive line from being burned. It should be noted that the fault current IF of the first conductive line depends on a withstand current of the first conductive line. In some embodiments, the fault current IF of the first conductive line is a maximum current that does not lead to a fault of the first conductive line. In this case, when a current in the first conductive line is smaller than or equal to the fault current IF of the first conductive line, no fault occurs in the first conductive line. Optionally, the fault current IF is a maximum current that causes no damage to a terminal connected with the first conductive line. In this case, when a current in the first conductive line is smaller than or equal to the fault current IF of the first conductive line, no damage is caused to the terminal connected with the first conductive line. Depending on the maximum operating current I of the first conductive line 121 and the fault current IF of the first conductive line 121, a fuse whose breaking current IT satisfies I<IT≤IF may be selected as the first fuse.

By connecting a fuse in series in each of the plurality of conductive lines to cut off a conductive line when a current in the conductive line is excessively large, the circuit board provided in the embodiments of the present disclosure is capable of preventing an excessive current from occurring in a conductive line, which in turn prevents a terminal connected with the conductive line from being burned, thereby reducing damage to the terminal.

Optionally, the fuse may be a polymer positive temperature coefficient (PPTC) fuse. The PPTC fuse has a relatively small resistance when the conductive line of the circuit board operates normally, such that the normal operation of the conductive line is not affected. When the current in the conductive line is excessively large, a temperature of the PPTC fuse increases and the resistance of the PPTC fuse increases sharply, such that the current of the conductive line in which the PPTC fuse is located decreases to a safe value, thereby achieving a function of limiting the current in the conductive line (i.e., a function of cutting off the conductive line) and in turn preventing a terminal connected with the conductive line from being burned. When the current in the conductive line returns back to normal, the temperature of the PPTC fuse decreases automatically, and the PPTC fuse returns to a state in which its resistance is relatively small. In embodiments of the present disclosure, in a case where the fuse is a normal fuse, this normal fuse opens due to an excessive current in the conductive line, and the open fuse has to be replaced with a new fuse for the circuit board, such that the circuit board can continue to operate. In contrast, in a case where the fuse is a PPTC fuse, the PPTC fuse performs a current-limiting function on a conductive line due to an excessive current in the conductive line, and there is no need to replace the PPTC fuse with a new fuse for the circuit board, because the circuit board can continue to work after the current in the conductive line returns back to normal.

In embodiments of the present disclosure, in a case where the fuse is a PPTC fuse, a breaking current IT of a first PPTC fuse is a minimum current that causes a change in a resistance value of the first PPTC fuse, that is, a minimum current that leads to a sharp increase of the resistance of the first PPTC fuse. Here, the first PPTC fuse is a PPTC fuse connected in series in the first conductive line. To make the first conductive line operate normally, the maximum operating current I of the first conductive line and a holding current IH of the first PPTC fuse satisfy: I≤IH, where IH is a maximum current that does not cause a change in the resistance value of the first PPTC fuse, i.e., IH is a maximum current that does not lead to a sharp increase of the resistance of the first PPTC fuse. Generally, IT:IH=2:1. It can be understood that, when the current I1 in the first conductive line is smaller than or equal to the holding current IH of the first PPTC fuse, the resistance of the first PPTC fuse will not increase sharply; when the current I1 in the first conductive line is larger than or equal to the breaking current IT of the first PPTC fuse, the resistance of the first PPTC fuse will increase sharply; when the current I1 in the first conductive line is larger than the holding current IH of the first PPTC fuse and smaller than the breaking current IT of the first PPTC fuse (i.e., IH<I1<IT), whether or not the resistance of the first PPTC fuse increases sharply depends on factors such as an ambient temperature, an assembly form and an initial resistance of the first PPTC fuse, and in this case, the resistance of the first PPTC fuse may not increase sharply, may increase sharply after a long time, or may increase sharply in a very short time.

It should be noted that, in a case where the fault current IF of the first conductive line in operation is larger than the maximum operating current Imax of the first PPTC fuse, or in a case where an operating voltage of the first conductive line is larger than a maximum operating voltage Vmax of the first PPTC fuse, the first PPTC fuse may be breakdown (i.e., the first PPTC fuse may be fused), and in this case, the first PPTC cannot return back to normal operation. Therefore, the maximum operating current Imax of the first PPTC fuse and the fault current IF of the first conductive line should satisfy: IF≤Imax, and the maximum operating voltage Vmax of the first PPTC fuse and the maximum operating voltage V of the first conductive line should satisfy: V≤Vmax. Here, the maximum operating current Imax of the first PPTC fuse is a maximum current that does not cause an irreversible damage to the first PPTC fuse, and the maximum operating voltage Vmax of the first PPTC fuse is a maximum voltage that does not cause an irreversible damage to the first PPTC fuse.

In practical applications, specifications of PPTC fuses may vary depending on various current signals, and thus the specification of the PPTC fuse may be selected based on the current signal transmitted through the conductive line. In some embodiments, the breaking current IT of the PPTC fuse, the maximum operating current I of the conductive line and the fault current IF of the conductive line may satisfy: I<IT≤IF; the maximum operating current I of the conductive line and the holding current IH of the PPTC fuse may satisfy: I≤IH; the maximum operating current Imax of the PPTC fuse and the maximum operating current I of the conductive line may satisfy: I≤Imax; the maximum operating voltage Vmax of the PPTC fuse and the maximum operating voltage V of the conductive line may satisfy: V≤Vmax. In actual selection of the specification of a PPTC fuse, a PPTC fuse whose specification satisfies the above conditions may be selected based on the maximum operating current I, the maximum operating voltage V and the fault current IF of the conductive line.

Figure 2:
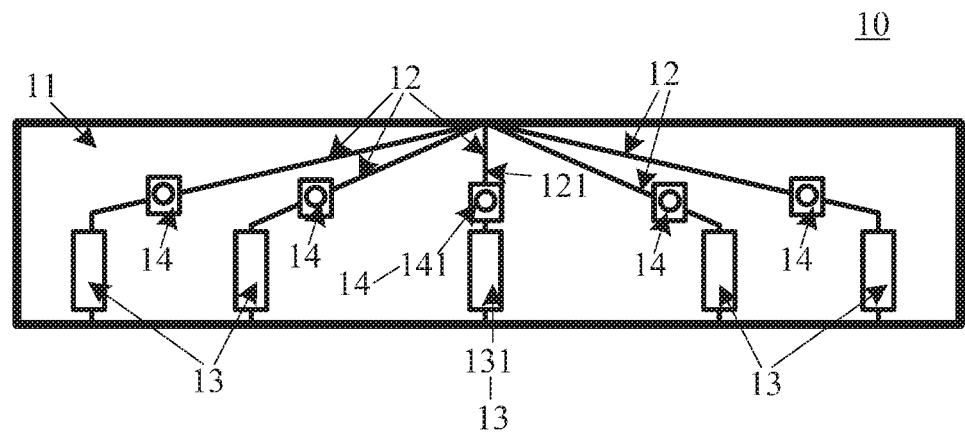
FIG. 2 is a schematic diagram illustrating another structure of a circuit board according to an embodiment of the present disclosure.

FIG. 2 is a schematic diagram illustrating another structure of a circuit board 10 according to an embodiment of the present disclosure. In the embodiment of the present disclosure, an alarm 14 is connected in series in each conductive line 12, as shown in FIG. 2. An alarm-triggering current IR of a first alarm 141, a maximum operating current I of a first conductive line 121 and a fault current IF of the first conductive line 121 satisfy: I<IR≤IF or IF≤IR, where the first alarm 141 is an alarm connected in series in the first conductive line 121. In an example, when there is a fault current in the first conductive line 121, a first fuse 131 opens, and in the meanwhile the first alarm 141 is triggered to generate an alarm signal, such that an operator can quickly find out which conductive line in the circuit board is abnormal. Optionally, the alarm is an audio-signal alarm or an optical-signal alarm. For example, in a case where the alarm is an optical-signal alarm, the optical-signal alarm connected in series in the first conductive line does not emit light when the first conductive line operates normally and sends out an optical signal (i.e., the optical-signal alarm emits light) when a fault current occurs in the first conductive line.

Optionally, the circuit board is any one of a single-sided board, a multi-sided board and a multilayer board.

Those skilled in the art should understand that a specific process of manufacturing the circuit boards can refer to corresponding process in following embodiments for convenience and brevity of description, and thus will not be repeated herein.

As above, by connecting a fuse in series in each of the plurality of conductive lines to cut off a conductive line when the current in the conductive line is excessively large, the circuit board provided in the embodiments of the present disclosure is capable of preventing an excessive current from occurring in a conductive line, which in turn prevents a terminal connected with the conductive line from being burned, thereby reducing damage to the terminal.

Embodiments of the present disclosure further provide a terminal test device, which may include any one of the above circuit boards. The circuit board may be that shown in FIG. 1 or FIG. 2.

Figure 3:
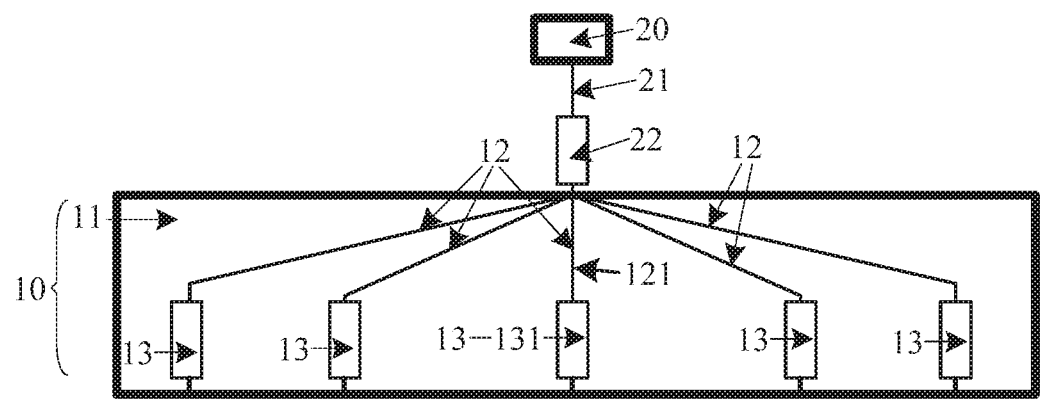
FIG. 3 is a schematic diagram illustrating a structure of a terminal test device according to an embodiment of the present disclosure.

FIG. 3 is a schematic diagram illustrating a structure of a terminal test device according to an embodiment of the present disclosure. As shown in FIG. 3, the terminal test device may further include a signal generator 20, which is connected with a circuit board 10 through a signal output bus 21. Optionally, an over-current protection assembly 22 is connected in series in the signal output bus.

Figures 1, 4:
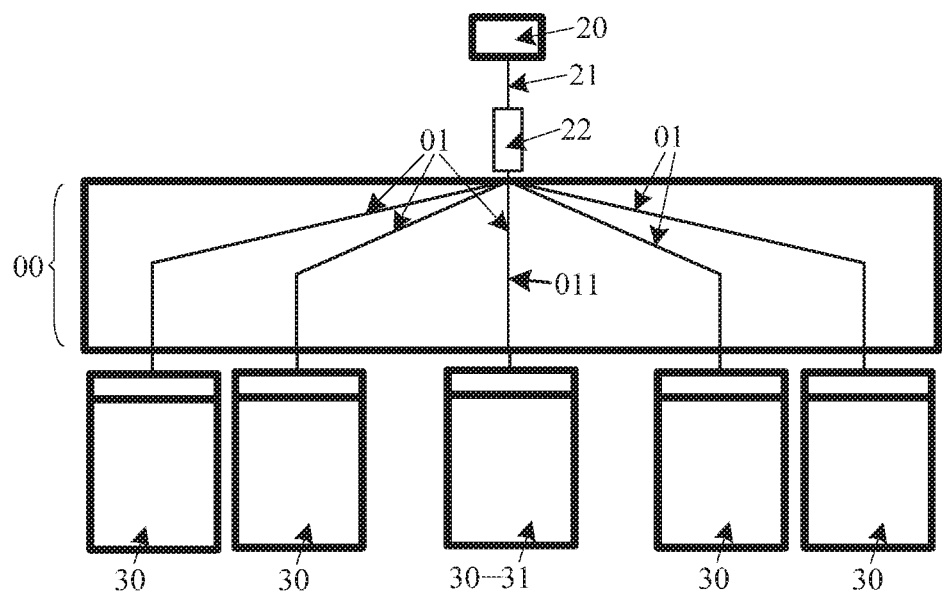
Figures 2, 4:
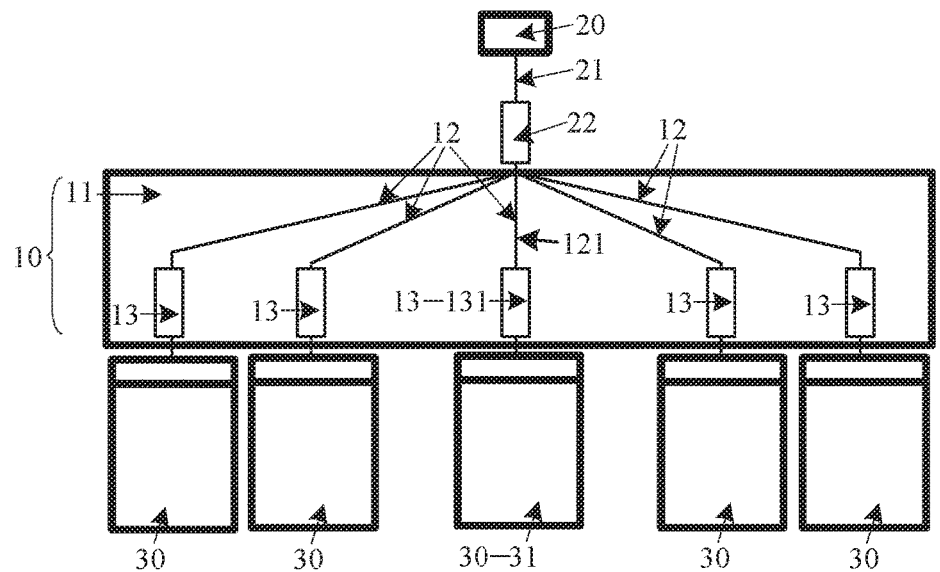

FIG. 4-1 is a schematic diagram illustrating terminals being tested by a terminal test device provided in a comparative example. In this comparative example, as shown in FIG. 4-1, a signal generator 20 is connected with a circuit board 00 through a signal output bus 21, in which an over-current protection assembly 22 is further connected in series. The circuit board 00 is not provided with a fuse. The circuit board 00 is provided with a plurality of conductive lines 01, each of which has one end connected with the signal output bus 21 and the other end connected with a terminal 30. When an abnormal event (e.g., an excessive current) occurs in a first conductive line 011, which may be any one of the plurality of conductive lines 01 in the circuit board 011, the over-current protection assembly 22 may not be disconnected in time, such that a first terminal 31 connected with the first conductive line 011 may be burned, causing a damage to the first terminal 31. When the over-current protection assembly 22 is disconnected, other terminals 30 cannot be tested, thereby lowering efficiency of testing the terminals 30. For example, assuming that the over-current protection assembly 22 will be disconnected when a total current output from the signal output bus 21 is larger than 10 amps (10 A), and that a terminal 30 connected with a conductive line 01 may be burned when a current in the conductive line 01 exceeds 2 A, in a case where a current in the first conductive line 011 is 2.5 A and currents in other conductive lines 01 are each 1.5 A, the over-current protection assembly 22 will not be disconnected as a total current flowing through the signal output bus 21 is 8.5 A (which is smaller than 10 A), but the first terminal 31 connected with the first conductive line 011 is prone to be damaged due to the excessive current of 2.5 A (which is larger than 2 A) in the first conductive line 011; and in a case where a current in the first conductive line 011 is 5 A and currents in other conductive lines 01 are each 1.5 A, the over-current protection assembly 22 will be disconnected as a total current flowing through the signal output bus 21 is 11 A (which is larger than 10 A), and the other terminals 30 cannot be tested due to the disconnection of the over-current protection assembly 22.

FIG. 4-2 is a schematic diagram illustrating terminals being tested by a terminal test device according to an embodiment of the present disclosure. In the embodiment of the present disclosure, as shown in FIG. 4-2, a signal generator 20 is connected with a circuit board 10 through a signal output bus 21, in which an over-current protection assembly 22 is further connected in series. The circuit board 10 is provided with a plurality of conductive lines 12, each of which has one end connected with the signal output bus 21 and the other end connected with a terminal 30. A fuse 13 is connected in series in each conductive line 12. When an abnormal event (e.g., an excessive current) occurs in a first conductive line 121, which may be any one of the plurality of conductive lines 12, a first fuse 131, which is the fuse connected in series in the first conductive line 121, will open automatically, such that a first terminal 31 connected with the first conductive line 121 is prevented from being burned, thereby reducing damage to the first terminal 31. Further, according to the terminal test device of the embodiment of the present disclosure, when an abnormal event (e.g., an excessively large current) occurs in the first conductive line 121, only the first fuse 131 connected in series in the first conductive line 121 is disconnected and the over-current protection assembly 22 connected in series in the output bus 21 will not be disconnected, such that tests on other terminals will not be affected, thereby improving efficiency of testing the terminals 30. For example, assuming that the over-current protection assembly 22 will be disconnected when a total current output from the output bus 21 is larger than 10 amps (10 A), and that a fuse 13 connected in series in a conductive line 12 will be disconnected when a current in the conductive line 12 exceeds 2 A, in a case where a current in the first conductive line 121 is 2.5 A (which exceeds 2 A), the first fuse 131 connected in series in the first conductive line 121 will open, thereby preventing the terminal 31 connected with the first conductive line 121 from being burned; and in a case where a current in the first conductive line 121 is 5 A and currents in other conductive lines 12 are each 1.5 A, the first fuse 131 connected in series in the first conductive line 121 will open (the first fuse 131 functions prior to the over-current protection assembly 22), the over-current protection assembly 22 will not be disconnected as a total current flowing through the signal output bus 21 is 6 A (which is smaller than 10 A), and therefore, the tests on the other terminals will not be affected.

Optionally, the fuse in the present embodiment may be a PPTC fuse. In this case, if a conductive line is disconnected, there is no need to replace the disconnected fuse with a new fuse for the circuit board, and the circuit board can continue to operate after the current in the conductive line returns back to normal.

Those skilled in the art should understand that the specific operating principle of the circuit board in the present embodiment can refer to the embodiments describing the structure of the circuit board as above for convenience and brevity of description, and will not be repeated herein.

As above, by connecting a fuse in series in each of the plurality of conductive lines to cut off a conductive line when a fault current occurs in the conductive line, the terminal test device provided in the embodiments of the present disclosure is capable of preventing an excessive current from occurring in a conductive line, which in turn prevents a terminal connected with the conductive line from being burned, thereby reducing damage to the terminal. Further, when a current in a conductive line is a fault current, only the fuse connected in series in the conductive line open and the over-current protection assembly 22 connected in series in the signal output bus will not be disconnected, such that tests on other terminals will not be affected, thereby improving efficiency of testing the terminals.

Figure 5:
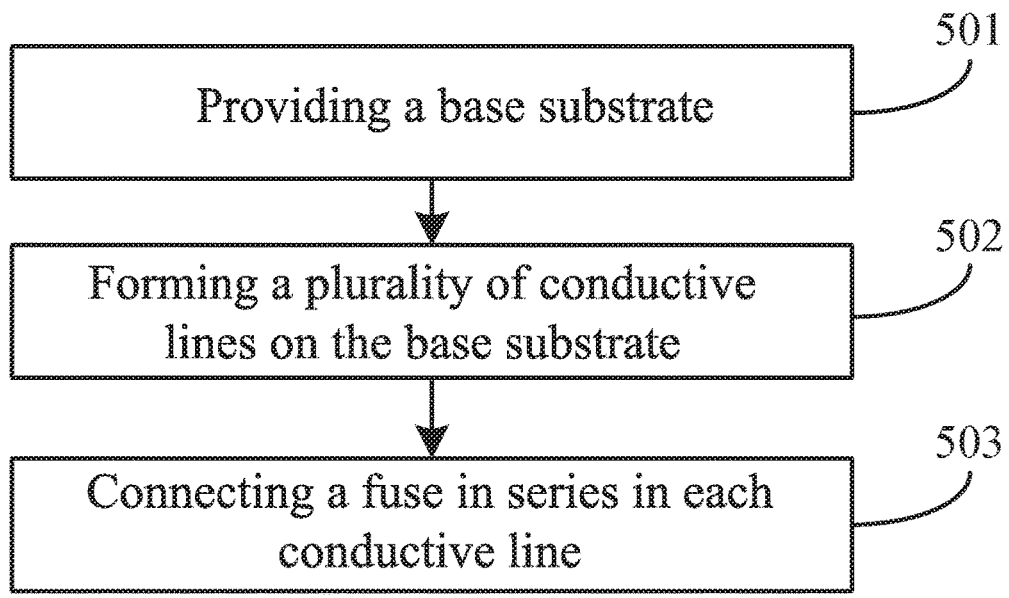
FIG. 5 is a flowchart illustrating a method for manufacturing a circuit board according to an embodiment of the present disclosure.

Embodiments of the present disclosure further provide a method for manufacturing a circuit board. FIG. 5 is a flowchart illustrating a method for manufacturing a circuit board according to an embodiment of the present disclosure. As shown in FIG. 5, the method may include steps 501 to 503.

At step 501, a base substrate is provided.

At step 502, a plurality of conductive lines are formed on the base substrate.

In this step, each of the plurality of conductive lines has one end formed to be connected with a signal generator and the other end formed to be connected with a terminal.

At step 503, a fuse is connected in series in each conductive line.

In this step, a breaking current IT of a first fuse, a maximum operating current I of a first conductive line and a fault current IF of the first conductive line satisfy: $I < IT \leq IF$, where the first conductive line may be any one of the plurality of conductive lines, the first fuse is the fuse connected in series in the first conductive line, and the breaking current IT of the first fuse is a minimum current that causes the first fuse to open.

Optionally, the fuse is a PPTC fuse.

Optionally, the maximum operating current I of the first conductive line and a holding current IH of a first PPTC fuse satisfy: $I \leq IH$, where the first PPTC fuse is a PPTC fuse connected in series in the first conductive line, and the holding current IH of the first PPTC fuse is a maximum current that does not lead to a change of a resistance value of the first PPTC fuse.

Optionally, a maximum operating current Imax of the first PPTC fuse and the fault current IF of the first conductive line satisfy: $IF \leq Imax$, where the maximum operating current Imax of the first PPTC fuse is a maximum current that does not cause a damage to the PPTC fuse.

Optionally, a maximum operating voltage Vmax of the first PPTC fuse and a maximum operating voltage V of the first conductive line satisfy: $V \leq Vmax$, where the maximum operating voltage Vmax of the first PPTC fuse is a maximum voltage that does not cause a damage to the PPTC fuse.

Optionally, the method may further include: connecting an alarm in series in each conductive line.

In some embodiments, an alarm-triggering current IR of a first alarm, the maximum operating current I of the first conductive line and the fault current IF of the first conductive line satisfy: $I < IR \leq IF$ or $IF \leq IR$; the first alarm is an alarm connected in series in the first conductive line.

Optionally, the alarm is an audio-signal alarm or an optical-signal alarm.

Those skilled in the art should understand that the specific operating principle of the circuit board in the present embodiment can refer to the embodiments describing the structure of the circuit board as above for convenience and brevity of description, and will not be repeated herein.

By forming a plurality of conductive lines on a base substrate and connecting a fuse in series in each conductive line to cut off a conductive line when a current in the conductive line is a fault current, the method for manufacturing a circuit board provided in the embodiments of the present disclosure is capable of preventing an excessive current from occurring in a conductive line, which in turn prevents a terminal connected with the conductive line from being burned, thereby reducing damage to the terminal.

Those skilled in the art should understand that part or all of the steps in the above embodiments can be implemented by hardware or instructing related hardware using instructions that may be stored in a computer readable storage medium. The computer readable storage medium may be a read only memory, a disk or an optical disc.

The foregoing implementations are merely preferred embodiments of the present disclosure, and are not intended to limit the present disclosure. Any modifications, equivalents and improvements that are made without departing from the spirit and principle of the present disclose shall be contained in the protection scope of the present disclosure.

What is claimed is:

1. A circuit board, comprising:
a base substrate; and a plurality of conductive lines on the base substrate, each of the plurality of conductive lines having one end configured to be connected with a signal output bus of a signal generator and the other end configured to be connected with a terminal, wherein a fuse is connected in series in each conductive line, and a breaking current IT of the fuse, a maximum operating current I of the conductive line and a fault current IF of the conductive line satisfy:

$I<IT\leq IF;$ where the breaking current IT of the fuse is a minimum current that causes the fuse to open, and the fault current IF of the conductive line is one of a maximum current that does not lead to a fault of the first conductive line and a maximum current that causes no damage to a terminal connected with the first conductive line.

2. The circuit board of claim 1, wherein the fuse is a polymer positive temperature coefficient (PPTC) fuse.

3. The circuit board of claim 2, wherein the maximum operating current I of each conductive line and a holding current IH of the PPTC fuse connected in series in the conductive line satisfy:

$I\leq IH;$ where the holding current IH of the PPTC fuse is a maximum current that does not lead to a change of a resistance value of the PPTC fuse.

4. The circuit board of claim 3, wherein the fault current IF of each conductive line and a maximum operating current Imax of the PPTC fuse connected in series in the conductive line satisfy:

$IF\leq I\text{max};$ where the maximum operating current Imax of the PPTC fuse is a maximum current that does not cause a damage to the PPTC fuse.

5. The circuit board of claim 4, wherein a maximum operating voltage V of each conductive line and a maximum operating voltage Vmax of the PPTC fuse connected in series in the conductive line satisfy:

$V\leq V\text{max};$ where the maximum operating voltage Vmax of the PPTC fuse is a maximum voltage that does not cause a damage to the PPTC fuse.

6. The circuit board of claim 1, wherein an alarm is connected in series in each conductive line, and an alarm-triggering current IR of the alarm, the maximum operating current I of the conductive line and the fault current IF of the conductive line satisfy:

$I<IR\leq IF,$ or, $IF\leq IR.$

7. The circuit board of claim 6, wherein the alarm is an audio-signal alarm.

8. The circuit board of claim 6, wherein the alarm is an optical-signal alarm.

9. The circuit board of claim 1, wherein the circuit board is any one of a single-sided board, a multi-sided board and a multilayer board.

10. A terminal test device, comprising the circuit board of claim 1.

11. The terminal test device of claim 10, further comprising a signal generator connected with the circuit board through the signal output bus.

12. The terminal test device of claim 11, wherein an over-current protection assembly is connected in series in the signal output bus.

13. A method for manufacturing a circuit board, comprising:

providing a base substrate;

forming a plurality of conductive lines on the base substrate, each of the plurality of conductive lines having one end formed to be connected with a signal output bus of a signal generator and the other end formed to be connected with a terminal; and connecting a fuse in series in each conductive line, a breaking current IT of the fuse, a maximum operating current I of the conductive line and a fault current IF of the conductive line satisfying:

$I<IT\leq IF;$ where the breaking current IT of the fuse is a minimum current that causes the fuse to open, and the fault current IF of the conductive line is one of a maximum current that does not lead to a fault of the first conductive line and a maximum current that causes no damage to a terminal connected with the first conductive line.

14. The method of claim 13, wherein the fuse is a polymer positive temperature coefficient (PPTC) fuse.

15. The method of claim 14, wherein the maximum operating current I of each conductive line and a holding current IH of the PPTC fuse connected in series in the conductive line satisfy:

$I\leq IH;$ where the holding current IH of the PPTC fuse is a maximum current that does not lead to a change of a resistance value of the PPTC fuse.

16. The method of claim 14, wherein the fault current IF of each conductive line and a maximum operating current Imax of the PPTC fuse connected in series in the conductive line satisfy:

$IF\leq I\text{max};$ where the maximum operating current Imax of the PPTC fuse is a maximum current that does not cause a damage to the PPTC fuse.

17. The method of claim 16, wherein a maximum operating voltage V of each conductive line and a maximum operating voltage Vmax of the PPTC fuse connected in series in the conductive line satisfy:

$V\leq V\text{max};$ where the maximum operating voltage Vmax of the PPTC fuse is a maximum voltage that does not cause a damage to the PPTC fuse.

18. The method of claim 13, further comprising:

connecting an alarm in series in each conductive line, an alarm-triggering current IR of the alarm, the maximum operating current I of the conductive line and the fault current IF of the conductive line satisfy:

$I<IR\leq IF$ or $IF\leq IR.$

* * * * *